United States Patent [19]

Bierhoff et al.

[11] Patent Number: 5,350,916
[45] Date of Patent: Sep. 27, 1994

[54] OPTOELECTRONIC DEVICE AND METHOD OF MANUFACTURING SAME WITH AN ELECTRICALLY INSULATING MEDIUM HAVING A STRIP-SHAPED FLEXIBLE FOIL

[75] Inventors: Martinus P. M. Bierhoff; Peter Coops; Dirk C. Van Eck; Joannes H. F. C. Sieben, all of Eindhoven, Netherlands

[73] Assignee: U.S. Philips Corporation, New York, N.Y.

[21] Appl. No.: 85,513

[22] Filed: Jun. 30, 1993

[30] Foreign Application Priority Data

Jul. 1, 1992 [EP] European Pat. Off. ........ 92201960.9

[51] Int. Cl.⁵ .............................................. H01J 40/14
[52] U.S. Cl. .................................. 250/214.1; 257/668
[58] Field of Search ................ 250/214.1, 214 R, 216, 250/208.2; 257/668, 672, 675, 676

[56] References Cited

U.S. PATENT DOCUMENTS

| | | | |
|---|---|---|---|
| 4,347,436 | 8/1982 | Fukuda et al. | 250/214.1 |
| 4,891,687 | 1/1990 | Mallik et al. | 257/676 |
| 4,893,901 | 1/1990 | Taumberger . | |
| 4,924,079 | 5/1990 | Opheij et al. | 250/201.5 |
| 5,010,246 | 4/1991 | Tsuyuguchi et al. | 250/216 |

FOREIGN PATENT DOCUMENTS

| | | |
|---|---|---|
| 0308749 | 3/1989 | European Pat. Off. . |
| 0339900 | 11/1989 | European Pat. Off. . |
| 0348950 | 1/1990 | European Pat. Off. . |

*Primary Examiner*—David C. Nelms
*Assistant Examiner*—Que T. Le
*Attorney, Agent, or Firm*—William L. Botjer

[57] ABSTRACT

Optoelectronic devices in which optoelectronic components comprising a diode laser are fastened on a carrier plate having good heat conduction, and in which the carrier plate is provided with connection conductors for the components which are separated from the carrier plate by an electrically insulating medium, are used inter alia in equipment for optical reading and/or writing of information carriers such as CD (audio) or CDROM. The known device is comparatively expensive, especially because of the necessity of using a special connector when a flexible connection is desired. According to the invention, the electrically insulating medium comprises a strip-shaped flexible foil which carries conductor tracks, extends over and beyond the carrier plate, is fastened on the carrier plate, and has a void above the carrier plate in which the diode laser is present. As a result, the device has a flexible connection possibility without a special connector being necessary, while in addition—as in the known device—a good alignment, listening, and heat removal of the diode laser are possible. The manufacture and modification of the device according to the invention are also simpler and cheaper. Preferably, the device comprises within the void also a photodiode and a monitor diode, while the components are screened by means of a cover which is fastened on the carrier plate and which comprises a window containing one or several optical gratings. Such a so-called LDGU (=Laser Detector Grating Unit) is particularly suitable for use in the equipment mentioned above. The invention also relates to a favourable method of manufacturing such an optoelectronic device.

13 Claims, 3 Drawing Sheets

OPTOELECTRONIC DEVICE AND METHOD OF MANUFACTURING SAME WITH AN ELECTRICALLY INSULATING MEDIUM HAVING A STRIP-SHAPED FLEXIBLE FOIL

BACKGROUND OF THE INVENTION

The invention relates to an optoelectronic device comprising a thermally well-conducting carrier plate provided with at least one optoelectronic component comprising at least one semiconductor diode laser, which carrier plate is provided with connection conductors which are separated from the carrier plate by means of an electrically insulating medium and to which the optoelectronic components provided on the carrier plate are connected by means of electrical connections. The invention also relates to a method of manufacturing such a device.

Such optoelectronic devices are used inter alia as components of a read and/or write head of information-processing equipment such as laser printers, bar code readers and read and/or write equipment for optical registration carriers such as CD (Audio) and CDROM (dam) discs.

Such a device is known from European Patent Application No. 89111789.7 published on Jan. 3rd, 1990 under number 0 348 950. FIGS. 1A and 1B therein show a device in which a semiconductor diode laser (12) and also a photodiode (13) are present on a heat sink (14) which is present on a metal carrier plate. The carrier plate is provided with connection conductors in the form of conducting pins (2, 4) arranged in lead-through holes and separated from the carrier plate by means of an electrically insulating medium which surrounds the pins (2, 4). The electrical connection between the optoelectronic components (12, 13) and the connection conductors (2, 4) is effected by means of wires.

A disadvantage of the known device is that, if a flexible cord or foil is used for the electrical connection, which is desirable for many applications of the device, an additional, non-standard connection is necessary between the conducting pins and the cord or foil. This renders the device comparatively expensive.

SUMMARY OF THE INVENTION

The present invention has for its object inter alia to provide an optoelectronic device which does not involve the said disadvantage, or at least to a much lesser degree, and which can be manufactured in an inexpensive and easy manner.

The invention is based inter alia on the recognition that the envisaged object can be realized by uncoupling the electrical connection from the mechanical fastening of the (opto)electronic components.

According to the invention, an optoelectronic device of the kind mentioned in the opening paragraph is for this purpose characterized in that the electrically insulating medium comprises a strip-shaped flexible foil in which the connection conductors are present in the form of conductor tracks, while the flexible foil extends beyond and above the carrier plate, is fastened thereon, and comprises a void above the carrier plate within which void at least the semiconductor diode laser is present. The use of a strip-shaped flexible foil extending to outside the carrier plate means that the device is provided with a flexible connection. The provision of the foil on the carder plate renders a connector near the carrier plate redundant, while the conductor tracks in the foil continue to adjacent the (opto)electronic components, so that electrical connections between conductor tracks and components can be formed in a simple manner, for example, by means of wire connections. As a result, the device according to the invention is particularly inexpensive both owing to a small number of components required and owing to its ease of manufacture. The provision of a void in the foil on the carrier plate and the arrangement of the diode laser in this void achieve that the semiconductor diode laser is thermally well-connected to the carrier plate, so that a good heat removal is realized and an undesirable temperature rise of the diode laser does not take place. Moreover, the diode laser and possible other components of the device can be readily and accurately aligned relative to the carrier plate and be fastened thereon in a secure and stable manner. The alignment of the foil relative to the carrier plate is allowed to be comparatively inaccurate and its fastening on the carrier plate need not be particularly stable. As a result, the foil may be fastened on the carrier plate in a simple manner, for example, by means of glue. These aspects also mean that the device according to the invention is not only effective but also very inexpensive. The said advantages further imply that the device according to the invention can be comparatively compact, which is highly desirable in view of miniaturization. The conductor tracks preferably terminate in contact surfaces to which the components are connected, directly or via wires. The carrier plate is made of a thermally well-conducting material such as ceramic material, semiconductor material, or a metal. The diode laser is fastened thereon—possibly by means of a heat sink made from one of the materials mentioned, as the case may be. The foil comprises, for example, a polyimide or polyester film in which copper conductor tracks are present.

In an important embodiment, the carrier plate comprises a metal and a cover is fastened thereon which envelops the optoelectronic components and which comprises a window through which radiation can enter or leave the device. The use of a metal, preferably steel carrier plate means that the device according to the invention can be manufactured cheaply and easily. In addition, one of the conductor tracks may be interconnected with the carrier plate in a simple manner—i.e. without a wire connection —, so that the carrier plate can act as a connection conductor for the (opto)electronic components. The cover on the one hand protects the optoelectronic components and on the other hand can be easily and accurately aligned relative to the diode laser and any other optoelectronic component which may be present. If the cover is also made of metal, it can be readily fastened to the carrier plate, for example, by means of welds. For this purpose, the foil preferably comprises one or several further voids, for example, adjacent the edge of the carrier plate. The edge of the cover is for this purpose provided with an interruption where it is present above the foil. Preferably, the height of this interruption is so chosen that the cover, after being fastened to the carrier plate, exerts no or at most a slight pressure on the portion of the foil situated below the edge of the cover. To render welding of the cover possible, the edge of the cover is bent outwards so that it can be fastened to the carrier plate from above, for example by means of laser welding.

In a preferred embodiment, the optoelectronic device according to the invention comprises, furthermore, a detector in the form of a preset photodiode and a monitor diode which are present within the void, and the device comprises a transparent plate which is provided with at least one optical grating. Such a device, often referred to as LDGU (=Laser Detector Grating Unit), is particularly suitable for use in a read and/or write head of a read and/or write device for an optical registration carrier. For further particulars on the optical construction and operation of this embodiment and the further advantages connected therewith, the reader is referred to an embodiment described below and to the European Patent Application No. 89203033.9 which corresponds to U.S. Pat. No. 4,924,079 by Applicant, published under No. 0 372 629 on Jun. 13th, 1990. In a favourable modification, the device further comprises an amplifier for the signals generated by the detector and/or a supply unit for the semiconductor diode laser. Preferably, these are integrated with the detector. The device according to the invention is particularly suitable for such an integration since it offers a high degree of design freedom. In a further modification, the device also comprises electronic components which are present on the portion of the foil situated above the carrier plate and which are directly connected to the conductor tracks therein. Such components, such as resistors and/or capacitors, may be used, for example, for the power control of the diode laser. They may be readily provided by means of the so-called surface mounting technology with glued, soldered, or clamped connections. The miniaturization and integration of the device is promoted by this. The concept of integration may be interpreted as the accommodation in the device of an amplifier and/or laser supply, which may or may not be integral with the detector, as described above. They may comprise separate components such as a resistor and/or capacitor.

Preferably, the conductor tracks in the portion of the foil situated above the carrier plate are provided in a pattern which is adapted to the optimum positioning of the optoelectronic or electronic components. The distances from the conductor tracks to the components are comparatively short as a result, which renders the provision of electrical connections easier. The pattern may be readily changed, so that a device according to the invention offers the said high degree of design freedom. The sequence in which the components are connected to the conductor tracks is an example of this.

Preferably, the void in the foil takes the shape of a hole. As a result, the portions of the foil adjoining the void are somewhat rigid and fixed, and the foil can be fastened on the carrier plate more easily. Preferably, furthermore, the foil comprises a further void in the form of a hole, on either side of which the conductor tracks extend, near that edge of the carrier plate over which the foil extends to beyond the carrier plate. The flexibility of the foil near its fastening to the carrier plate is enhanced by this, especially when the strip-shaped foil is comparatively wide owing to a large number of conductor tracks. Any torsion in the portion of the foil situated outside the carrier plate is accommodated more readily as a result, and only a small force is exerted on the fastening of the foil then.

A method of manufacturing a device according to the invention is characterized in that one or several strip-shaped openings are made in a strip-shaped plate so as to define a carrier plate within the said plate, after which a strip-shaped flexible foil of an insulating material and provided with conductor tracks is fastened on the carder plate, which foil extends over one of the openings beyond the carrier plate and has a void above the carrier plate, after which at least one optoelectronic component, comprising at least one semiconductor diode laser, is provided on the carrier plate within the void and is electrically connected to the conductor tracks. Such a method according to the invention has the advantage that the device is surrounded by a frame formed by the portion of the carrier lying outside the carrier plate proper. As a result, the device according to the invention can be readily manipulated during manufacture. The removal of the device from the strip-shaped plate may be put off, if so desired, until the end phase of manufacture. Simple and inexpensive techniques such as stamping may be used for providing the strip-shaped openings.

In a preferred embodiment of the method, a metal is chosen as the material for the carrier plate, a photodiode and a monitor diode are aligned relative to the diode laser within the void, are fastened on the carrier plate and are connected to the conductor tracks, after which a metal cover provided with a window is aligned relative to the diode laser and the photodiode and is fastened on the carrier plate by means of welds, after which a transparent plate provided with at least one optical grating is aligned relative to the semiconductor diode laser and the photodiode above the window and is fastened on the cover. Steel is preferably chosen as the material for the carrier plate and the cover, so that these can be readily manufactured and welded together, preferably by means of laser welding. Accurate positioning of the window and the grating relative to the diode laser and the photodiode is also easily carried out in this way. Thus a device according to the invention is obtained in a simple and inexpensive manner, highly suitable for use in equipment for optical registration carriers.

Besides inside the void, further (opto)electronic components may also be advantageously provided on the portion of the foil situated above the corner plate, by means of the surface mounting technology.

Preferably, a series of adjacent carrier plates is formed in the strip-shaped plate (one behind the other). Such a method is highly suitable for a continuous and (partly) automated embodiment thereof. Such a method also offers a great advantage during preliminary testing or "burn-in" testing of the devices. The strip-shaped plate may subsequently be subdivided into several partial strips each comprising a number of devices according to the invention, which will not be removed from the relevant partial strip until the end phase of the manufacturing process.

In a further modification of a method according to the invention, a series of further openings is provided in the plate, which openings act as alignment marks for the components provided on the carrier plate and/or as engagement points for a transport mechanism of the strip-shaped plate.

BRIEF DESCRIPTION OF THE DRAWINGS

The invention will now be described in more detail with reference to an embodiment and the accompanying drawing, in which FIG. 1 diagrammatically shows an embodiment of an optoelectronic device according to the invention in perspective view and partly in exploded view.

The figures are diagrammatic and not drawn to scale, the dimensions in the thickness direction being particularly exaggerated for the sake of clarity. Corresponding parts are usually given the same reference numerals in the various Figures.

DETAILED DESCRIPTION OF THE PREFERRED EMBODIMENT

Figure 1:
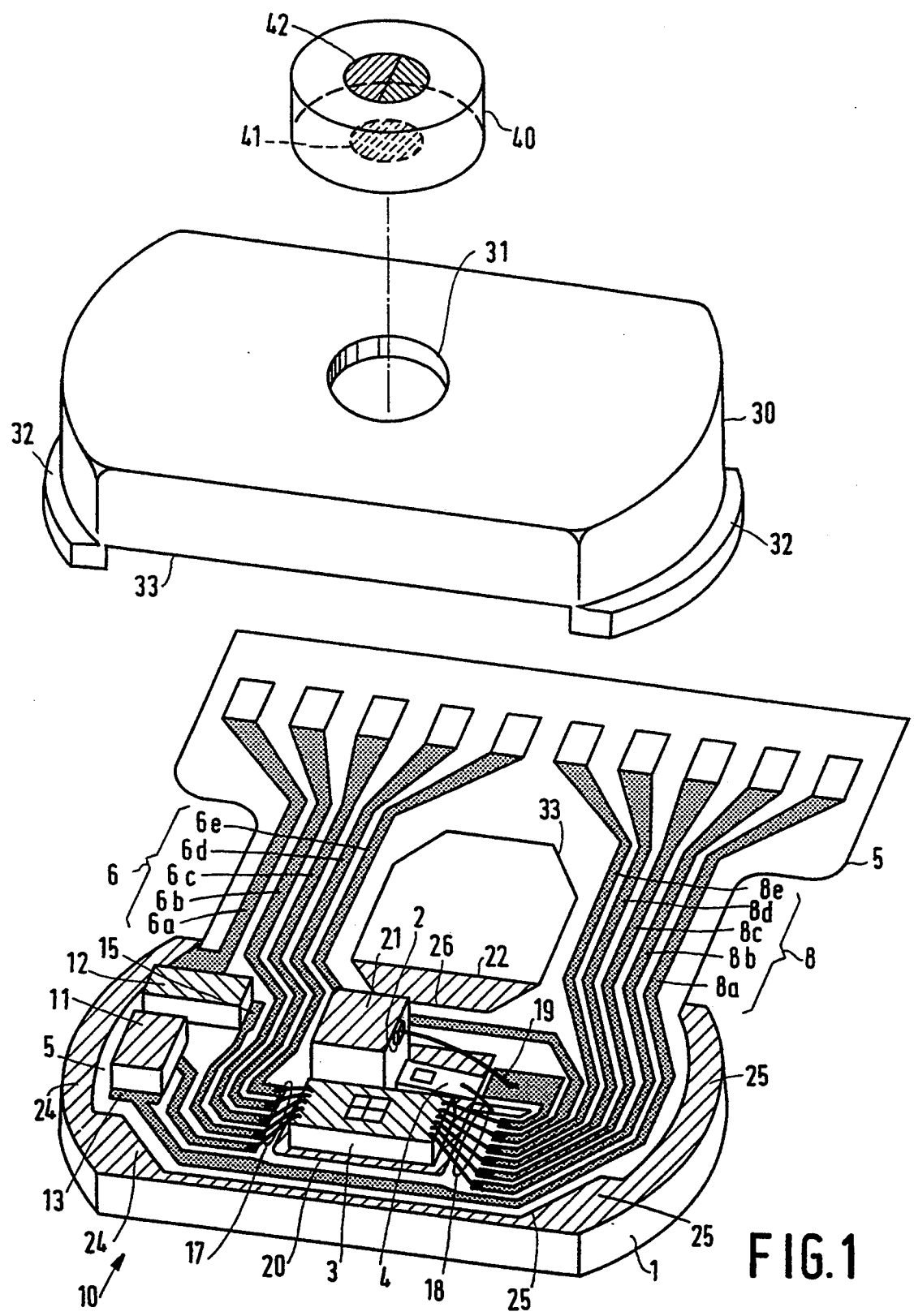
Figure 2:
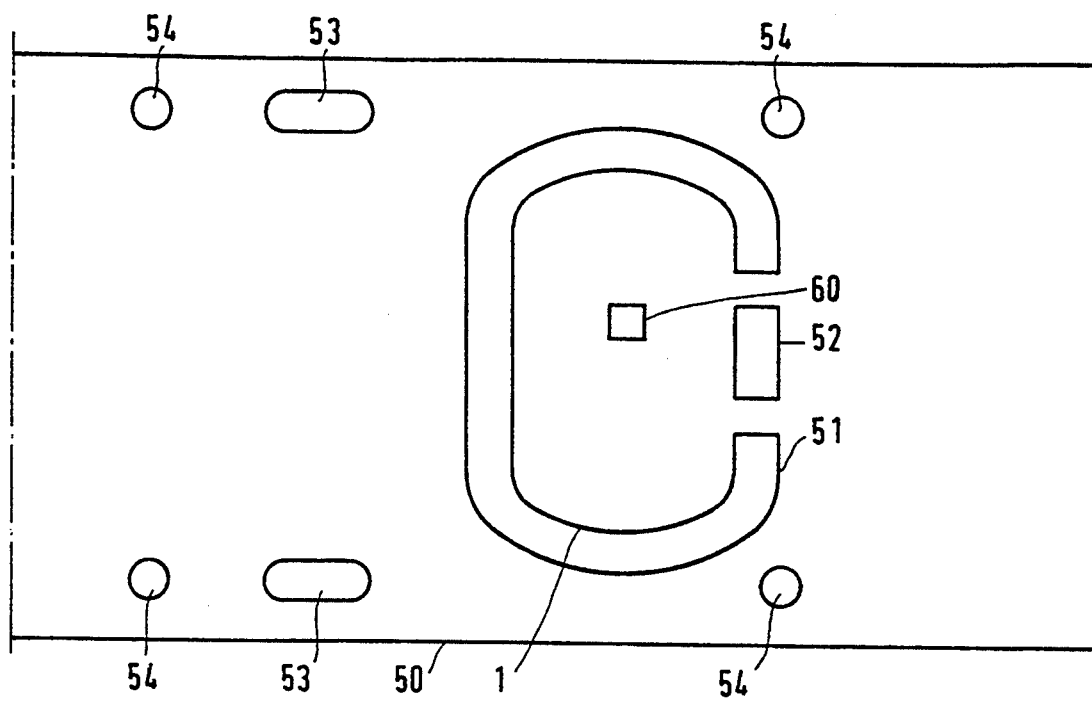
FIGS. 2 to 5 are diagrammatic plan views of the optoelectronic device of FIG. 1 in consecutive stages of manufacture by means of a method according to the invention.
Figure 3:
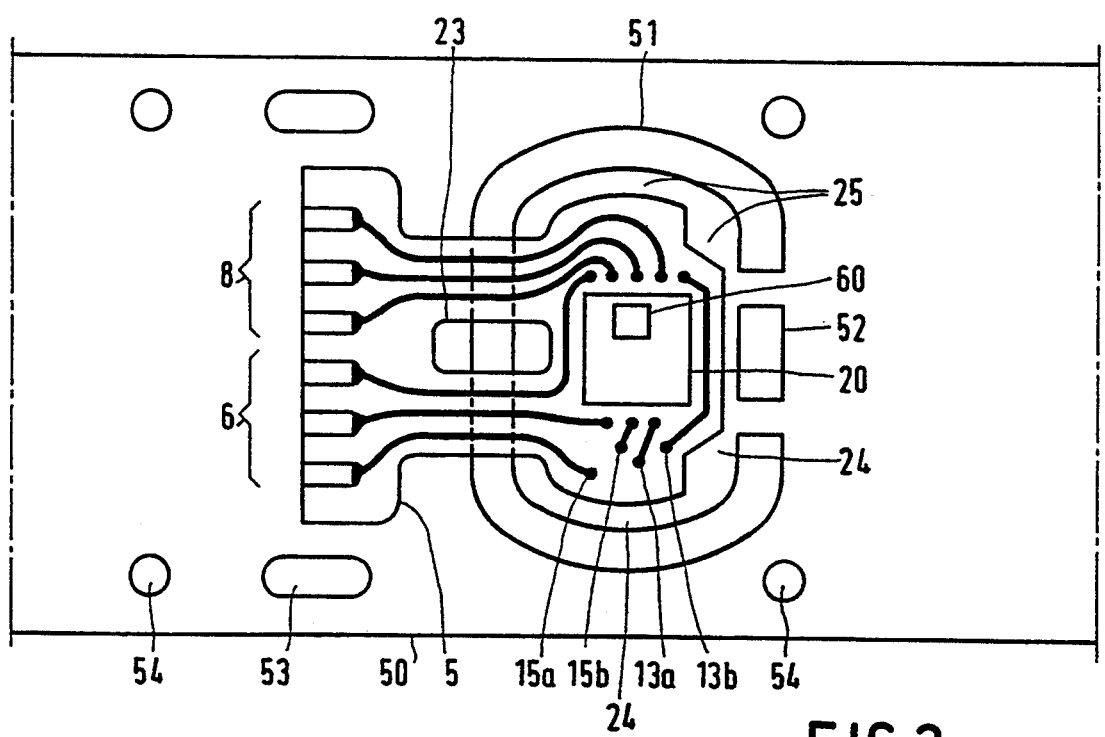
Figure 4:
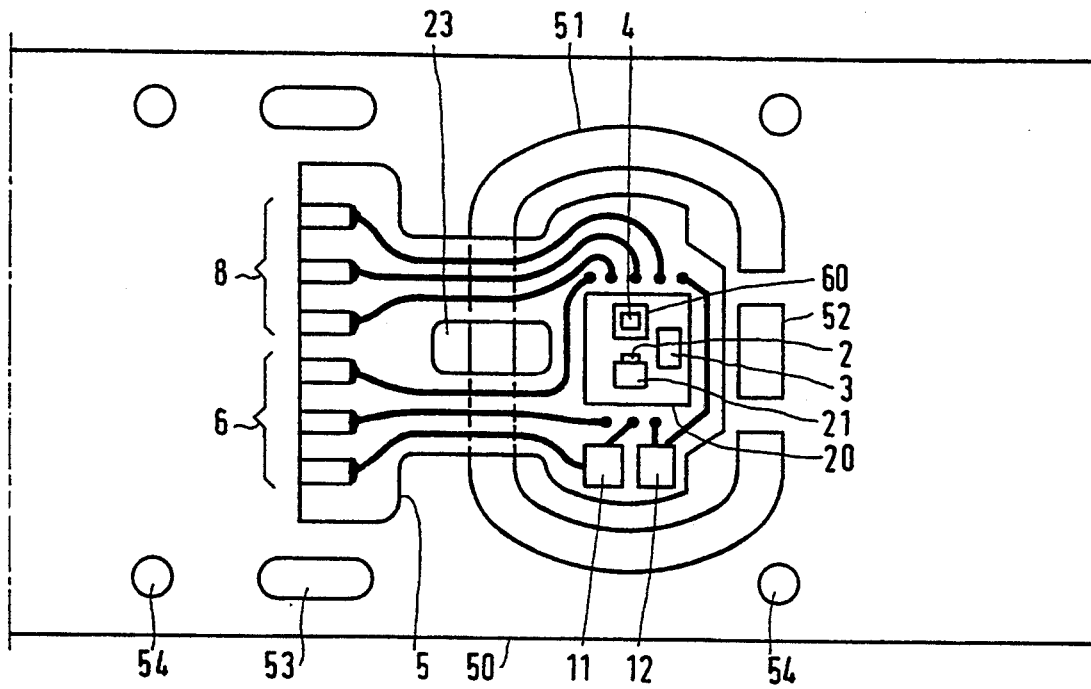
Figure 5:
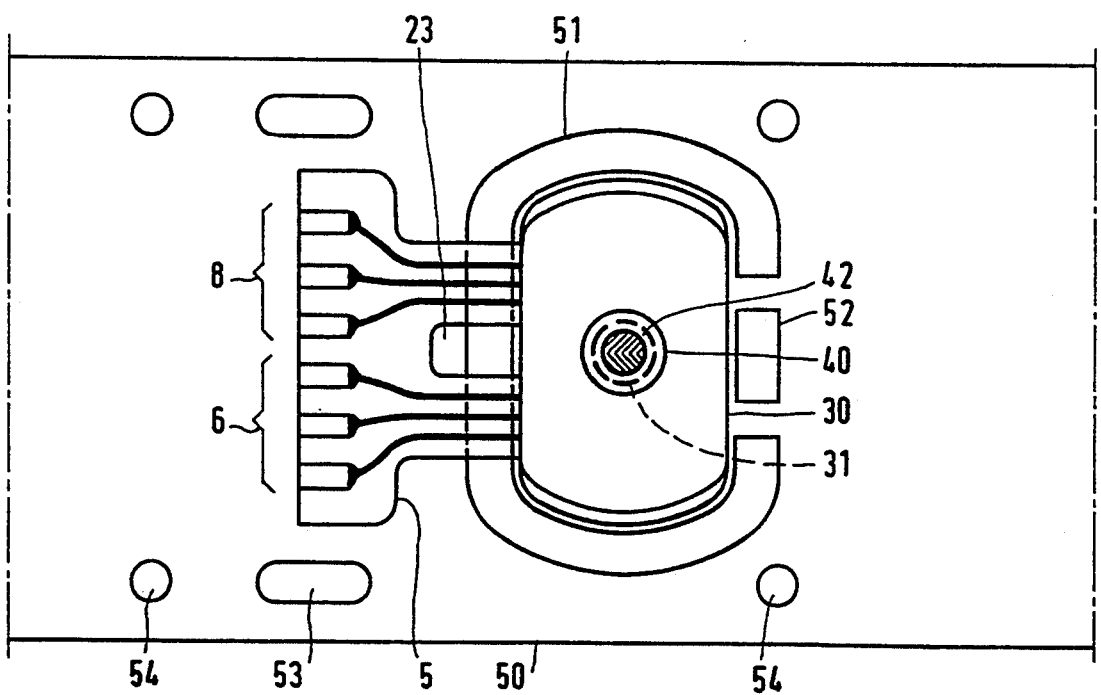

FIG. 1 diagrammatically shows an embodiment of an optoelectronic device according to the invention in perspective view and partly in exploded view. The optoelectronic device 10 comprises a carrier plate 1, here made of steel, and is provided with at least one optoelectronic component comprising at least one semiconductor diode laser 2 which is fastened on the carrier plate 1, in this case by means of a copper heat sink 21 provided with an indium layer. The carrier plate is further provided with an electrically insulating medium 5 which has connection conductors 6, 8 for connection of the optoelectronic components provided on the carrier plate 1, among which the semiconductor diode laser 2, by means of electrical connections 19, 21. According to the invention, the electrically insulating medium 5 comprises a strip-shaped flexible foil in which the connection conductors 6, 8 are present in the form of conductor tracks 6, 8, while the flexible foil 5 extends to outside and above the carrier plate 1, is fastened on the latter, and comprises a void 20 above the carrier plate 1 within which at least the diode laser 2 is arranged. Since the flexible foil 5 extends beyond the carrier plate 1, it forms a flexible connection so that no additional connector is necessary. As a result, the device 10 according to the invention is comparatively inexpensive. The provision of the foil 5 with a void 20 and the arrangement of the diode laser 2 therein achieve that the semiconductor diode laser 2 is thermally well-connected to the carrier plate 1, so that a good heat removal is realized and an undesirable temperature rise of the diode laser 2 does not take place. In addition, the necessary alignment of the diode laser 2 can now take place relative to the carrier plate 1, so that this alignment can be readily and accurately realized. A pattern of conductor tracks 6, 8 is formed in the portion of the foil 5 present on the carrier plate 1, which pattern is adapted to the optoelectronic components 2, 3, 4 present and which may be easily changed. The design freedom is great as a result and changes in design can be implemented in an inexpensive manner. The alignment of the foil 5 relative to the carrier plate I is allowed to be comparatively inaccurate, and its fastening on the carrier plate 1 need not be particularly stable. Accordingly, the foil 5 may be fastened on the carrier plate 1 in a simple manner, for example, by gluing. These aspects also render the device 10 according to the invention not only effective but also very inexpensive. In the present example, the carrier plate 1 comprises a metal, here steel, on which metal a cover 30 is fastened, here also made of steel, which envelops the optoelectronic components, in this case besides the diode laser 2 a photodiode 3 and a monitor diode 4 by which the output of the diode laser 2 is monitored, and which comprises a window 31 through which radiation can enter or leave the device 10. Such a device 10 is particularly suitable for use in equipment for reading and/or writing of an optical registration carrier. For this application, the device 10 is provided with a grating 42 which separates the radiation reflected by the registration carrier—not shown in FIG. 1—and entering the device 10 again from the radiation emitted by the diode laser 2 and directed towards the photodiode 3. This grating 42 transforms the reflected beam in such a way that a focus error signal can be derived therefrom by means of the composite photodiode 3. Preferably, the device 10 is provided with a second grating 41 which splits up the radiation beam emitted by the diode laser 2 into three beams, so that three radiation spots are formed on the registration carrier with which a tracking signal can be generated. As shown in FIG. 1, the grating 42 may be provided at the upper side of a transparent plate 40 and the second grating 41 on the lower side thereof. The plate 40 may be provided on or in the window 31. For further particulars on the operation and construction of a device provided with gratings 41, 42, reference is made to the European Patent Application No. 89203033.9 cited in the introductory section.

In the present example, the device 10 also comprises electronic components, here a resistor 11 and a capacitor 12 which are arranged above the carrier plate 1 on the foil 5 and are directly connected to portions of the conductor tracks 6, 8 by means of "surface mounting", in this case to portions 13 and 15, respectively, of the conductor tracks 6a and 8a. These components serve, for example, for a power control (not shown) of the diode laser 2 in the device 10, which power control is here integrated with the photodiode 3. In the present example, an amplifier (also not shown) is also included in the device 10. This amplifier is also integrated with the photodiode 3 and serves to amplify the electric signals generated by the photodiode 3. The device 10 is compact and also inexpensive (in manufacture) as a result of the fact that part of the components is positioned on the foil 5. The pattern of conductor tracks, 6, 8 situated in the portion of the foil 5 present above the carrier plate 1 is adapted to an optimum arrangement of the optoelectronic 2, 3, 4 and electronic 11, 12 components. In the present example, track 6a conducts a supply voltage, 6b a data signal, 6c a laser monitoring signal, tracks 6d, 6e, 8e, 8d, 8c and 8b conduct detector signals and track 8a conducts an earth signal. The void 20 here comprises a hole in the foil 5 owing to which the foil 5 is readily manageable and easy to fasten to the carrier plate 1. The strip-shaped foil 5 here comprises a further void 23 near that edge 22 of the carrier plate 1 over which the foil 5 projects to outside the carrier plate 1, which void takes the shape of a hole 23 on either side of which the conductor tracks 6, 8 are present. Because of the hole 23, any torsion present in the foil 5 leads to only a slight load on the bond between the foil 5 and the carrier plate 1. The cover 30 comprises projecting portions 32, here in the form of portions 32 of the cover 30 bent outwards, which are fastened on the carrier plate 1 at the area of voids 24, 25 in the foil 5, here by means of laser welds. Through a suitable choice of the height of the projecting portions 32, the cover 30 exerts no or at most a slight pressure on the foil 5 where this is present below the cover 30 at the area of interruptions 33. The dimensions of the carrier plate 1 are approximately $10 \times 8 \times 1$ mm$^3$ here. The foil 5 is approximately 10 mm wide and the conductor tracks, ten in this case, are each approximately 0,5 mm wide. The portions of the conductor tracks 6, 8 situated at the free foil end are widened and thickened, and suitable for further connection. The metal cover 30 here has dimensions of approximately $10 \times 8 \times 2$ mm$^3$ and is approximately 0,2 mm thick. The window 31 has a diameter of 4 mm and the plate 40 has a diameter of 5 mm and is 3 mm thick. The hole 20 is approximately 3×3 mm² large, and the dimensions of the heat sink 21 (with the diode laser arranged thereon), the photodiode 3 and the monitor diode 4 are 1×1×1 mm³, 2,5×1,5×0,4 mm³, and 1×1×0,2 mm³ respectively.

The optoelectronic device 10 described may be manufactured by a method according to the invention in the following way (see FIGS. 2 to 5). Manufacture starts with (see FIG. 2) a strip-shaped thermally well-conducting plate 50, which is made of steel in the present case. One or several strip-shaped openings, here two openings 51, 52 are formed in this plate, for example, by stamping, so as to define a carrier plate 1 within the plate 50. Openings 53, 54 are also formed in the plate 50, serving for mechanical transport of the plate 50 and for the alignment of a semiconductor diode laser 2 to be arranged on the carrier plate 1. A void 60 whose bottom encloses a small angle with the plate 50 is provided in the carrier plate 1 for the purpose of accommodating a monitor diode 4. Then a strip-shaped flexible foil 5 comprising conductor tracks 6, 8 (see FIG. 3) is fastened on the carrier plate 1. Some conductor tracks are interrupted and comprise contact faces 13a, 13b, 15a and 15b. It is noted that FIGS. 3 to 5 only depict some of the conductor tracks present in FIG. 1 for keeping the drawing simple. The foil 5 is so provided that it extends over one of the openings 51, 52, here the opening 51, to outside the carrier plate 1 and is so shaped that it comprises a void 20, here in the shape of a hole 20, above the carrier plate 1. Then (see FIG. 4) at least one optoelectronic component, comprising a semiconductor diode laser 2, is aligned relative to the carrier plate I within the void 20, fastened on this carrier plate, and electrically connected to the conductor tracks 6, 8. In this example, a thermally and electrically conducting heat sink 21, with the diode laser 2 arranged on a lateral surface thereof, is fastened on the carrier plate 1 with an electrically conducting glue. The carrier plate is electrically connected to one of the conductor tracks 6, 8. The diode laser 2 is in addition connected to one of the conductor tracks 6, 8 by means of a wire connection (not shown in FIG. 4). In this example, not only the diode laser 2 but also a photodiode 3 and a monitor diode 4 are aligned and provided on the carrier plate 1, and are electrically connected to portions of the conductor tracks 6, 8 by means of wires (also not shown in FIG. 4). An amplifier for signals from the photodiode 3 and a supply control unit for the diode laser 2 are also included in the device 10 in the present example, integrated with the photodiode 3. In addition, electronic components, here a resistor 11 and a capacitor 12, are provided on the portion of the foil 5 situated above the carrier plate 1 for the supply control mentioned above, and are directly connected to the conductor tracks, in this case by means of "surface mounting" on the contact faces 13a, 13b, 15a and 15b of FIG. 3. Subsequently a cover 30, also made of steel in this case, is aligned and fastened on the carrier plate 1, here by means of laser welds (see FIG. 5), which cover 30 envelops the optoelectronic 2, 3, 4 and electronic 11, 12 components and comprises a window 31 through which radiation can enter or leave the device. The edge of the cover 30 is provided with projecting portions (not visible in FIG. 4) at the area where it is welded to the carrier plate 1 and where the foil 5 comprises further voids 23, 24, 25, which projecting portions ensure that the cover does not exert more than a slight pressure on the foil 5 where the latter is present below the edge of the cover 30. After the cover 30 has been provided, a transparent plate 40 is aligned relative to the diode laser 2 and the photodiode 3 on the window 31, which plate 40 is provided with at least one, and preferably two optical gratings 41, 42 which are present preferably at the lower side and upper side, respectively, of the plate 40. Then the plate 40 is fastened to the cover 30, in this case by gluing. Preferably, as also in the present example, a series of adjacent carrier plates 1 is formed in the plate 50. This is not depicted in FIGS. 3 to 5 for the sake of simplicity. Finally, an optoelectronic device according to the invention is obtained by the removal of the carrier plate 1 from the plate 50. This is done in that the portions of the plate 50 situated between the openings 51 and 52 are removed, for example, are stamped out.

The invention is not limited to the embodiment described, since many modifications and variations are possible to those skilled in the art without departing from the scope of the invention. Thus the carrier plate need not necessarily comprise an electrically conducting material. A ceramic carrier plate would also be eligible. This plate could locally be provided with a metal track, for example, for welding the covers. An advantage of such a carrier plate is that no electric tension can be present on this plate during the use of the device, so that the cover also is not under electric tension.

We claim:

1. An optoelectronic device (10) comprising a thermally well-conducting carrier plate (1) provided with at least one optoelectronic component (2) comprising at least one semiconductor diode laser (2), which carrier plate (1) is provided with connection conductors (6, 8) which are separated from the carrier plate (1) by means of an electrically insulating medium (5) and to which the optoelectronic components (2) provided on the carrier plate (1) are connected by means of electrical connections (19, 21), characterized in that the electrically insulating medium (5) comprises a strip-shaped flexible foil (5) in which the connection conductors (6, 8) are present in the form of conductor tracks (6,8), while the flexible foil (5) extends beyond and above the carrier plate (1), is fastened thereon, and comprises a void (20) above the carrier plate (1), within which void at least the semiconductor diode laser (2) is present.

2. An optoelectronic device (10) as claimed in claim 1, characterized in that the carrier plate (1) comprises a metal and a cover (30) is fastened thereon which envelops the optoelectronic component (2) and which comprises a window (31) through which radiation generated by the semiconductor diode laser (2) can enter or leave the device (10).

3. An optoelectronic device (10) as claimed in claim 1, characterized in that a photodiode (3) and a monitor diode (4) are present within the void (20), and the device (10) comprises a plate (40) of transparent material which is provided with at least one optical grating (41, 42).

4. An optoelectronic device (10) as claimed in claim 1, characterized in that the device (10) comprises an amplifier for the signals generated by the photodiode (3) and/or a supply unit for the semiconductor diode laser (2) which are preferably integrated with the photodiode (3).

5. An optoelectronic device (10) as claimed in claim 4, characterized in that the device (10) further comprises electronic components (11, 12) which are present on the portion of the foil (5) situated above the carrier plate (1) and which are directly connected to the conductor tracks (6,8) therein.

6. An optoelectronic device (10) as claimed in claim 1, characterized in that the conductor tracks (6, 8) in the portion of the foil (5) situated above the carrier plate (1) are provided in a pattern which is adapted to the optimum positioning of the optoelectronic (2, 3, 4) or electronic (11, 12) components.

7. An optoelectronic device (10) as claimed in claim 1, characterized in that the void (20) in the foil (5) comprises a hole in the foil (5).

8. An optoelectronic device (10) as claimed in claim 1, characterized in that the foil (5) comprises a further void in the form of a hole (23), on either side of which the conductor tracks (6, 8) extend, near that edge (22) of the carrier plate (1) over which the foil (5) extends to beyond the carrier plate (1).

9. A method of manufacturing an optoelectronic device (10) as claimed in claim 1, characterized in that one or several strip-shaped openings (51, 52) are made in a strip-shaped plate (50) so as to define a carrier plate (1) within the said plate, after which a strip-shaped flexible foil (5) of an insulating material and provided with conductor tracks (6, 8) is fastened on the carrier plate (1), which foil (5) extends over one (51) of the openings (51, 52) to beyond the carrier plate (1) and has a void (20) above the carrier plate (1), after which at least one optoelectronic component (2), comprising at least one semiconductor diode laser (2), is provided on the carrier plate (1) within the void (20) and is electrically connected to the conductor tracks (6,8).

10. A method as claimed in claim 9, characterized in that a metal is chosen as the material for the carrier plate (1), a photodiode (3) and a monitor diode (4) are also aligned relative to the diode laser (2) within the void (20), are fastened on the carrier plate (1) and are connected to the conductor tracks (6,8), after which a metal cover (30) provided with a window (31) is aligned relative to the diode laser (2) and the photodiode (3) and is fastened on the carrier plate (1) by means of welds, after which a transparent plate (40) provided with at least one optical grating (41, 42) is aligned relative to the semiconductor diode laser (2) and the photodiode (3) above the window (31) and is fastened on the cover (30).

11. A method as claimed in claim 9, characterized in that electronic components (11, 12) are provided on the portion of the foil (5) situated above the carrier plate (1) by means of the surface mounting technology.

12. A method as claimed in claim 9, characterized in that a series of adjacent carrier plates (1) is formed in the strip-shaped plate (50).

13. A method as claimed in claim 9, characterized in that further openings (53, 54) are provided in the strip-shaped plate (50), which openings act as alignment marks or as engagement points for transport of the strip-shaped plate (50).

* * * * *